Figure 1:
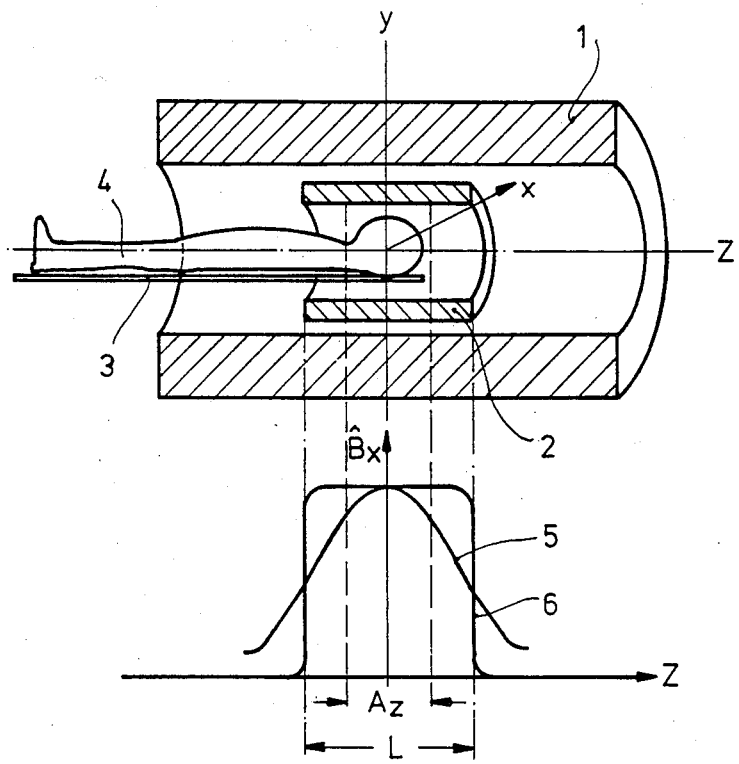

United States Patent [19]

Röschmann

[11] Patent Number: 4,725,781
[45] Date of Patent: Feb. 16, 1988

[54] COIL ARRANGEMENT FOR NUCLEAR MAGNETIC RESONANCE EXAMINATIONS

[75] Inventor: Peter Röschmann, Hamburg, Fed. Rep. of Germany

[73] Assignee: U.S. Philips Corporation, New York, N.Y.

[21] Appl. No.: 843,330

[22] Filed: Mar. 24, 1986

[30] Foreign Application Priority Data

Mar. 30, 1985 [DE] Fed. Rep. of Germany ....... 3511750

[51] Int. Cl.⁴ .............................................. G01R 33/20
[52] U.S. Cl. .................................... 324/318; 324/319; 335/301
[58] Field of Search ............... 335/211, 216, 299, 301; 324/300, 309, 318–320, 322; 128/653

[56] References Cited

U.S. PATENT DOCUMENTS

| | | | |
|---|---|---|---|
| 4,452,250 | 6/1984 | Chance | 324/311 |
| 4,490,675 | 12/1984 | Knuettel | 324/319 |
| 4,564,812 | 1/1986 | Van Dijk | 324/318 |
| 4,585,994 | 4/1986 | Ewing | 324/318 |
| 4,646,045 | 2/1987 | Chari et al. | 324/320 |

Primary Examiner—Michael J. Tokar
Attorney, Agent, or Firm—Paul R. Miller

[57] ABSTRACT

The invention relates to a coil arrangement for nuclear magnetic resonance examinations. The coil arrangement has conductors surrounded by a cylindrical shield. It is achieved by additional shields enclosing the openings of the coil arrangement for partly or entirely introducing the patient that the magnetic field in the longitudinal direction of the coil is highly constant.

12 Claims, 10 Drawing Figures

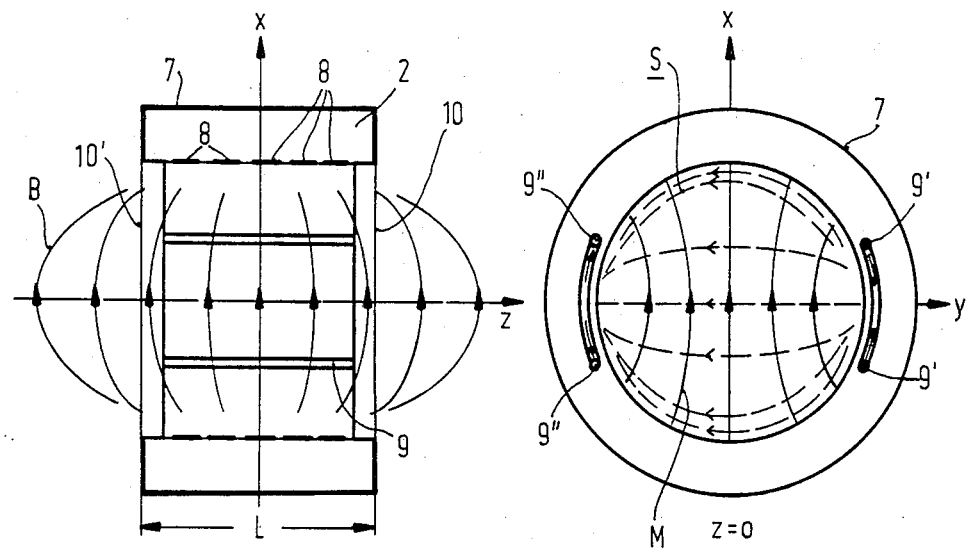
Fig.2a   Fig.2b
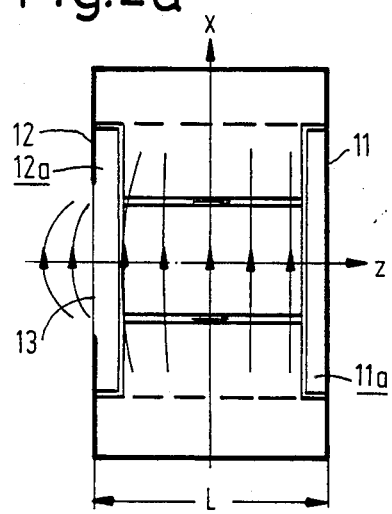   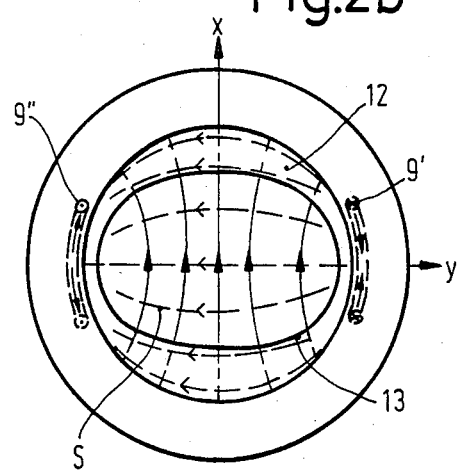
Fig.3a   Fig.3b

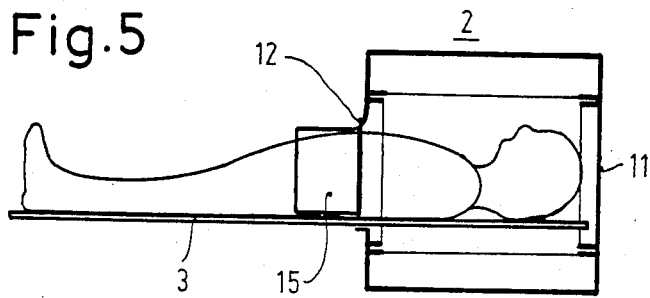
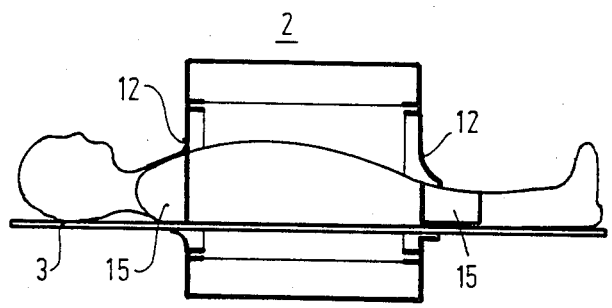
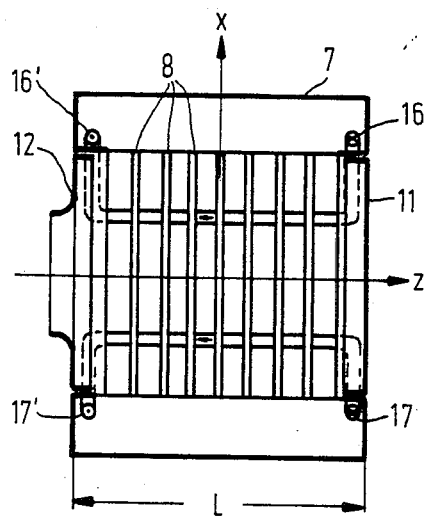
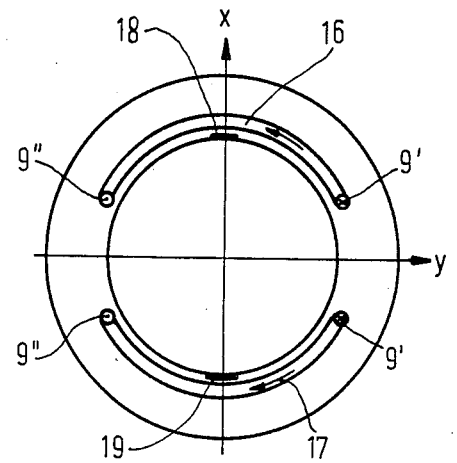

COIL ARRANGEMENT FOR NUCLEAR MAGNETIC RESONANCE EXAMINATIONS

The invention relates to a coil arrangement for nuclear magnetic resonance examinations for producing and/or receiving high-frequency magnetic fields comprising a conductor arrangement provided with openings for introducing a body to be examined and a cylindrical electrically conducting shield connected to ground and arranged to surround it.

Such a coil arrangement is known from "Program and Book of Abstracts", Society of Magnetic Resonance in Medicine", third Annual Meeting, Aug. 13-17 1984, New York.

In a nuclear magnetic resonance examination, a body, such as, a patient, to be examined is subjected to a strong homogeneous static magnetic field. The atomic nuclei contained therein have because of their nuclear magnetic resonance a magnetic moment which performs a precessional motion about the direction of the static magnetic field at a frequency dependent upon the nature of the atomic nucleus and upon the intensity of the static magnetic field, which is the so-called Larmor frequency. The Larmor frequency is proportional to the magnetic induction of the static magnetic field with the proportionality factor being defined by the so-called gyromagnetic ratio; and it amounts, for example, to about 42.57 MHz/T for hydrogen.

If a high-frequency magnetic field at right angles to the static magnetic field acts upon the body subjected to this static magnetic field, a nuclear magnetic resonance occurs at the frequency of this high-frequency magnetic field corresponding to the Larmor frequency, in which event the nuclei performing a precessional motion extract from the high-frequency magnetic field energy which is emitted again in the form of an electromagnetic wave at the Larmor frequency after the magnetic field has been switched off.

The coil arrangement of the kind mentioned in the opening paragraph serves to produce the high-frequency field or to receive the nuclear magnetic resonance signals occurring after the field has been switched off. It comprises, for example, four rectilinear conductors which extend in the direction of the static magnetic field, the z direction of a Cartesian coordinate system, and which are arranged in a cross-section at right angles to the z direction at the angular points of a rectangle or along the periphery of a circle. When a high-frequency magnetic field is produced, high-frequency currents of the same amplitude flow through all four conductors, but the currents are opposite to each other in conductors arranged diagonally opposite to each other. At the center of these four conductors, a comparatively homogeneous magnetic field is then obtained.

In the known coil arrangement, the four conductors are surrounded by a cylindrical shield, whose axis of symmetry extends in the z direction. As a result, the conductor arrangement is decoupled to a great extent from the environment outside the shield so that, on the one hand, external magnetic interference fields substantially do not influence the signals in the conductors, and on the other hand, the inductance of the coil arrangement is largely independent of its respective site. It should further be noted that at higher frequencies the dimensions of the conductors are no longer negligibly small with respect to the wavelength so that no longer a concentrated inductance is concerned.

Experiments have shown that the magnetic induction in the high-frequency field depends upon the z direction. It decreases from the center toward the ends of the conductor arrangement. The same dependence is also obtained in the case of a saddle coil of the kind described in European Patent Application 83201449.2.

The invention has for its object to provide a coil arrangement in which the magnetic induction depends less strongly upon the z direction than with the known coils.

According to the invention this object is achieved in a coil arrangement of the kind described in the opening paragraph in that at least one of the openings of the conductor arrangement is provided entirely, or in part, with an additional shield, which is connected to the cylindrical shield in an electrically conducting manner. The currents flowing in the conductors extending parallel to the z axis produce a magnetic field directed at right angles to the z axis.

Due to the fact that the openings, relatively offset in the z direction, are screened off entirely or in part by the additional shield, a concentration of the magnetic field is obtained with respect to the non-screened state at the ends of the conductor arrangement, i.e. at the area of the openings, which results in that the magnetic induction within the conductor arrangement depends only to a small extent upon the z direction.

Figure 4:
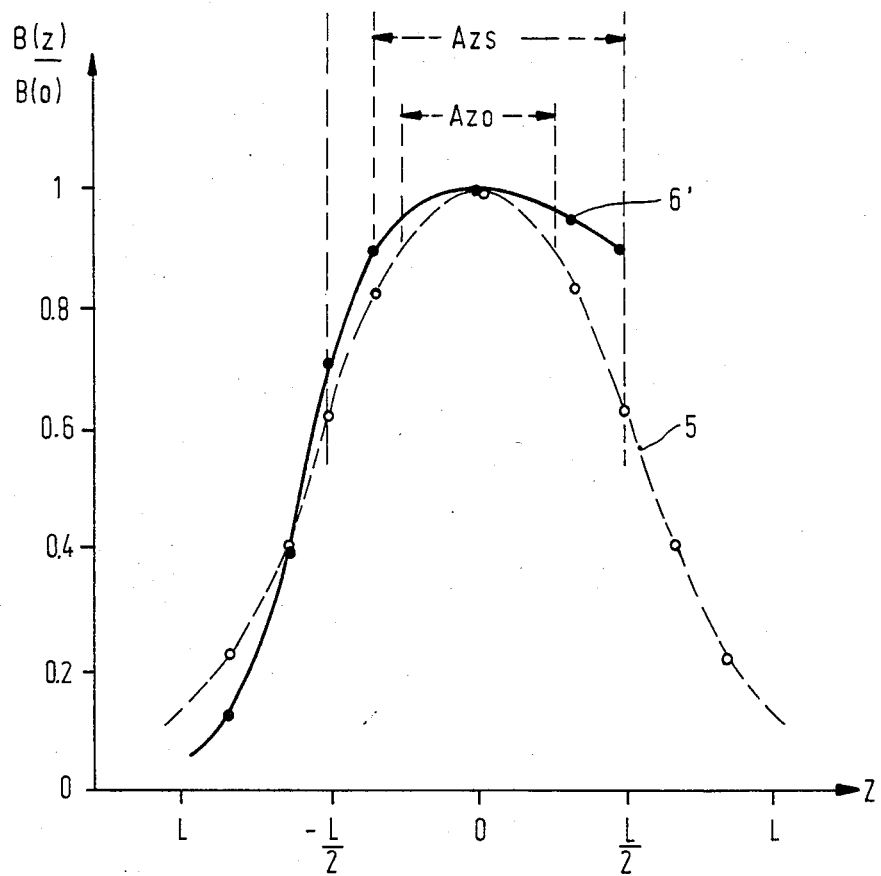

In order that the invention may be readily carried out, it will now be described more fully, by way of example, with reference to the accompanying drawing, in which:

FIG. 1 shows diagrammatically a nuclear magnetic resonance tomography apparatus together with the variation of the magnetic induction in the z direction, FIGS. 2a and b show the form of the magnetic field lines in a coil arrangement according to the ring resonator principle without the additional shield, FIGS. 3a and 3b show the form of the magnetic field lines in the same coil provided with the additional shield, FIG. 4 shows the dependence of the magnetic induction upon the z direction, FIGS. 5 and 6 show several embodiments of the shield and FIGS. 7a and 7b show a saddle coil constructed in accordance with the invention.

FIG. 1 shows diagrammatically in longitudinal sectional view a nuclear magnetic resonance tomograph, in which only the magnet 1 for producing the homogeneous static field, the coil 2 for producing and for receiving the high-frequency magnetic field and a couch 3 on which a patient 4 is situated are shown. The remaining parts of such an apparatus, such as gradient coils and the like, are not shown for the sake of clarity. The main magnet 1 is arranged coaxially with a z axis and at its center the high-frequency coil 2 is arranged, which is also coaxial with the z axis. The magnetic field produced thereby extends at right angles to the z axis, i.e. substantially in the x direction of a Cartesian coordinate system.

Below this diagrammatic representation, the variation of the magnetic induction B as a function of the z coordinate is indicated by the bell-shaped curve 5. A strong z dependence is apparent. An additional difficulty is that with the use of the high-frequency coil for receiving the nuclear magnetic resonance signals, the signals thus induced in the coil are smaller as they are farther remote from this plane. This results in that with such an apparatus, when a tomogram is recorded, the image brightness in a layer containing the z axis decreases with an increasing distance from the xy plane defining the maximum field intensity.

This disadvantage is usually eliminated in that the length L of the high-frequency coil 2 is chosen to be larger than the desired image length $A_z$ in the z direction, for example, two times larger, so that only the comparatively good homogeneity of the magnetic field intensity in the central range is utilized for image production. However, it is then disadvantageous that also the parts of the patient not shown in the image are subjected to a substantial high-frequency energy so that the overall high-frequency power absorbed by the patient increases and the resonance quality of the high-frequency coil loaded with the patient decreases to an unnecessarily great extent. Furthermore, with a larger constructional length of the high-frequency coil, wave propagation effects become manifest and the distance or separation of the operating frequency from the natural resonance frequency decreases. As a result, undesired electrical high-frequency fields are obtained at the patient area of the coil, which additionally give rise to high-frequency absorption in the patient and consequently to a further decrease of the resonance quality of the coil loaded with the patient.

The curve 6 indicates the ideal (rectangular) variation of the field intensity in the z direction. It can be seen that the field intensity is constant substantially over the entire coil length so that the effective length $A_z$ of the coil corresponds to its length L.

FIG. 2a shows a cross-section of the known high-frequency coil in an x-z plane, while FIG. 2b shows a cross-section in the x-y plane at the center (z=0). As can be seen from FIGS. 2a and 2b, the conductor arrangement of the coil comprises four conductors 9', 9' and 9", 9" which extend in the z direction and are arranged at the angular points of a rectangle and along the periphery of a circle, respectively. When a magnetic field is produced, high-frequency currents of the same amplitude flow through these conductors, the current in the pair of conductors 9', 9' having a direction opposite to that in the pair of conductors 9", 9". The conductor arrangement is located on a hollow cylinder of synthetic material, which is not shown further, but which is coaxial with the z axis and which is slightly longer than the conductor arrangement, and the hollow cylinder is connected through insulating connection strips (not shown either) to a second hollow cylinder of synthetic material having a larger diameter. A cylindrical shield 7 of an electrically good conducting non-ferromagnetic material, for example, copper foil or wire mesh, is arranged on the outer or the inner periphery of the second hollow cylinder. The shield 7 is connected to ground, like the conductive rings 8 on the inner or the outer side of the hollow cylinder (not shown) carrying the conductors 9', 9', 9", 9", which rings serve to suppress the magnetic field produced by the conductor arrangement in its interior and at the area of the arcuate connection strips between the conductors 9', 9', on the one hand, and 9", 9", on the other hand, and extending in the z direction as well as electric fields at the examination area.

As far as described hitherto, the coil arrangement is the subject matter of the prior European Patent Application 84201869.9.

FIGS. 2a and 2b further show the form of the magnetic field lines. Since the arrangement is symmetrical both to the z axis and to the central plane (z=0), a symmetrical form of the field lines results therefrom, but the magnetic field is "bulged" outwards at the area of the coil openings 10,10' at the ends of the conductor arrangement, that is where $z=\pm L/2$. Consequently, at these areas a lower field line density, i.e. a lower magnetic field intensity, is obtained than at the center (z=0) of the coil. In FIG. 2b, lines S are further indicated as broken lines, which extend at right angles to the direction of the magnetic field M.

The coil arrangement according to the invention shown in FIGS. 3a and 3b corresponds to the coil arrangement described with reference to FIG. 2, but the opening 10 is closed completely by a shield 11 and the opening 10' is partly closed by a shield 12, which is provided with an opening 13 having a surface area markedly smaller than that of the opening 10', for example by at least 10%.

The shields 11 and 12, like the shield 7, consist of electrically good conducting non-ferromagnetic material, for example, a copper foil or a mesh of copper wires, which are each effectively arranged on flat disks 11a and 12a of synthetic material having the same size and which are connected to the shield 7 in an electrically conducting manner. The two additional shields 11 and 12 are consequently situated in planes at right angles to the z axis.

Since due to the provision of the additional shield 11, a conductive surface is present in the immediate proximity of especially the righthand end of the coil, the magnetic field can also extend parallel to the conductive surface at this area, while in this case magnetic field components directed at right angles to the shields cannot occur. The magnetic field components parallel to the surface of the additional shield 11 produce currents therein having the form indicated in FIG. 3b by S, which corresponds to a great extent to that of the line S of FIG. 2b. Consequently, at the righthand end of the coil shown in FIG. 3a, a magnetic field form is obtained, which corresponds to a great extent to that at the center.

On the lefthand side, the conditions are not quite so favourable because the shield 12 has to be provided with an opening 13 for introducing the patient. Through this opening the magnetic field can emanate to the outside, but not in such a pronounced manner as in FIG. 2 because the opening is smaller than the opening defined by the conductor arrangement 9', 9".

FIG. 4 shows the variation of the magnetic induction (B)z along the z axis, related to the maximum B(O) of the magnetic induction in the central plane (Z=0), i.e. for the coils as shown in FIGS. 2 and 3. The curve 5 indicates the variation for the coil shown in FIG. 2, and the curve 6' indicates the variation for the coil shown in FIG. 3, i.e. with the shields 11 and 12. It can be seen that the range $A_{zo}$, in which the coil shown in FIG. 2 exhibits a drop of the magnetic induction of less than 10%, lies approximately between $z=-L/4$ and $z=+L/4$, while for the coil shown in FIG. 3 this range lies between $z=-L/3$ and $z=+L/2$. This means that the coil according to the invention with the same coil length has a considerably larger effective range for images in the x-z plane and the y-z plane, respectively, than the known coil shown in FIG. 2 and that the coil according to the invention can be considerably shorter than the known coil if in these planes a defined range of similar image quality should be contained. Moreover, the maximum of the induction B(0) in the central plane (z=0) is larger for a coil as shown in FIG. 3 than for a coil as shown in FIG. 2. Both effects result in that in the coil according to the invention less energy is required than in the known coil to cause the vector of the nuclear magnetization to tilt by means of the high-frequency field about a defined angle.

A further advantage of the shortening due to the use of the additional shields 11 and 12 is obtained at large static magnetic fields and at high Larmor frequencies. At high frequencies, the high-frequency current amplitude is no longer constant over the whole length L of the conductors due to wave propagation. If, for example, the coil is energized so that at the center ($z=0$) a maximum of the current occurs (current antinode), the amplitude of the current, and hence also the amplitude of the magnetic induction, decreases towards the conductor ends, which results in an additional decrease of the magnetic induction at the area of the openings. However, if the coils can be kept shorter, the decrease caused thereby is smaller. Moreover, the influence of external electromagnetic interference fields is even further reduced.

As appears from FIG. 5, the head or the upper breast part of the patient can be examined if the closed shield 11 is used on one side and the shield 12 provided with a opening is used on the other side. In order to reduce the emanation of the magnetic field from the opening area, together with the shield having an opening, a further flexible annular shield 15 is formed, which, after the patient has been introduced, is connected to the shield 12 through plug or clamp connections in an electrically conducting manner. If the middle or lower part of the patient's trunk should be examined, a coil is required having shields 12 provided on both sides with openings, to which an annular screen 15 may further be connected (FIG. 6). In order to avoid in this case the exchange of the coils, it is efficacious to construct at least the shield 11 as a removable insert so that it can be exchanged entirely for a shield 12 with an opening.

The conductive connections between the annular shield 15 and the shield 12 can be formed on the lower side by a series of lead-in contacts which are provided in the patient couch 3 at different levels and which snap on the lower side of the couch 3 into given contact areas while on the upper side they are on contact with the annular shield.

If the shield current variation S indicated in FIG. 3b is not essentially interrupted by the patient couch 3, (this can be attained, for example, by rotation of the coil 2 through 90°), a conductive connection between the shields 12 and 15 at the area of the patient couch may be dispensed with.

The flexible shields 12 and 15 may be made of meshes of textile or of Litze copper. The thickness of the shields should correspond to at least thrice the penetration depth at the frequency of the magnetic field, while the wires or foil strips from which the shields may be manufactured should preferably extend at right angles to the direction of the high-frequency magnetic field or approximately in the y direction.

In order to homogenize the magnetic field, it is useful to construct the shield 7 so that it also closes the end faces between the cylindrical parts of this shield and the shields 11 and 12.

FIGS. 7a and 7b show in longitudinal sectional view and in cross-section, respectively, a unit for producing a high-frequency magnetic field by means of a saddle coil. This saddle coil also comprises four conductors, which are arranged at the angular points of a rectangle, conductors arranged diagonally opposite each other each being traversed by a current of the same value, but of opposite polarity. The arcuate connection leads 16,17 and 16',17' each interconnect two conductors (9', 9''), which are traversed by the current in opposite directions. An external shield 7 encloses the saddle coil including the arcuate connection leads 16,16' and 17,17'. The coil openings are closed entirely and in part, respectively, by the removable shields 11 and 12, as a result of which it is achieved that, as in the unit shown in FIG. 3, the magnetic induction varies only comparatively slightly in the direction of the z axis. Also in this case, it is particularly favourable to use a Faraday shield which is present inside the coil and which comprises closed annular strips 8 each being connected on opposite sides above and below the center of the arcuate connection leads 16,16' and 17,17' by the connection strips 18,19 (cf. FIG. 7b) to the external high-frequency shield.

What is claimed is:

1. In a magnetic coil arrangement for nuclear magnetic resonance examinations comprising
   first magnetic coil means for providing a homogeneous static magnetic field in a Z direction,
   second magnetic coil means for providing high frequency magnetic fields and for receiving high frequency magnetic fields, said second magnetic coil means being disposed along said Z direction coaxially within said first magnetic coil means, and
   cylindrical shield means within said first magnetic coil means and connected to ground for surrounding said second magnetic coil means along said Z direction, said cylindrical shield means being an electrically conducting non-ferromagnetic material,
   said first magnetic coil means, said second magnetic coil means, and said cylindrical shield means having openings in said Z direction for introducing a body to be examined,
   the improvement comprising
   further shield means for at least partially closing at least one of said openings in said cylindrical shield means, said further shield means being electrically connected to said cylindrical shield means, and said further shield means being an electrically conductive non-ferromagnetic material,
   wherein said further shield means maintains magnetic induction of said second magnetic coil means near a maximum over substantial length of said second magnetic coil means.

2. A magnetic coil arrangement according to claim 1, wherein said further shield means entirely encloses one of said openings of said cylindrical shield means.

3. A magnetic coil arrangement according to claim 2, wherein said further shield means also partially encloses another of said openings of said cylindrical shield means, said another of said openings providing entrance for said body to be examined, and said another of said openings being smaller than openings of said second magnetic coil means.

4. A magnetic coil arrangement according to claim 3, wherein a flexible shield is disposed at said another of said openings, said flexible shield being electrically connected to said further shield means.

5. A magnetic coil arrangement according to claim 2 or claim 3, wherein said further shield means is disposed as a removable insert.

6. A magnetic coil arrangement according to claim 1 or claim 2 or claim 3, wherein said further shield means extend in a plane at right angles to said Z direction.

7. A magnetic coil arrangement according to claim 1 or claim 2 or claim 3, wherein said second magnetic coil means is a saddle coil structure.

8. A magnetic coil arrangement according to claim 1 or claim 2 or claim 3, wherein said first magnetic coil means, said second magnetic coil means, and said cylindrical shield means having said further shield means are a ring resonator.

9. A magnetic coil arrangement according to claim 1 or claim 2 or claim 3, wherein said further shield means is a material of copper foil or a mesh of copper wires, said material being arranged on flat disks.

10. A magnetic coil arrangement according to claim 9, wherein said electrically conducting non-ferromagnetic material of said cylindrical shield means is one of copper foil or wire mesh.

11. A magnetic coil arrangement according to claim 1 or claim 2 or claim 3, wherein said electrically conducting non-ferromagnetic material of said cylindrical shield means is one of copper foil or wire mesh.

12. A magnetic coil arrangement according to claim 1 or claim 2 or claim 3, wherein said second magnetic coil means has a length L along said Z direction, and wherein said further shield means maintains said magnetic induction near maximum over a length 5/6L.

* * * * *